(12) United States Patent
Masleid

(10) Patent No.: US 8,063,673 B2
(45) Date of Patent: Nov. 22, 2011

(54) TRANSIT STATE ELEMENT

(75) Inventor: Robert P. Masleid, Monte Sereno, CA (US)

(73) Assignee: Oracle America, Inc., Redwood City, CA (US)

( * ) Notice: Subject to any disclaimer, the term of this patent is extended or adjusted under 35 U.S.C. 154(b) by 129 days.

(21) Appl. No.: 12/345,020

(22) Filed: Dec. 29, 2008

(65) Prior Publication Data

US 2010/0164576 A1 Jul. 1, 2010

(51) Int. Cl.
*H03B 1/00* (2006.01)
*H03K 3/00* (2006.01)

(52) U.S. Cl. ........................................... 327/112

(58) Field of Classification Search ........... 327/108–112
See application file for complete search history.

(56) References Cited

U.S. PATENT DOCUMENTS

| | | | |
|---|---|---|---|
| 5,396,108 A * | 3/1995 | McClure | 327/108 |
| 6,426,652 B1 * | 7/2002 | Greenhill et al. | 326/83 |
| 7,071,747 B1 | 7/2006 | Masleid | |
| 7,119,580 B2 | 10/2006 | Masleid et al. | |
| 7,256,634 B2 | 8/2007 | Masleid | |

* cited by examiner

*Primary Examiner* — Lincoln Donovan
*Assistant Examiner* — Daniel Rojas
(74) *Attorney, Agent, or Firm* — Meyertons, Hood, Kivlin, Kowert & Goetzel, P.C.; Erik A. Heter

(57) ABSTRACT

A transit state element circuit. The transit state element circuit includes a clock input stage coupled to receive a clock signal, an output stage configured to drive an output signal on an output node and an activation stage coupled to an input node. The activation stage is configured to, responsive to the clock input stage detecting a transition from a first logic level to a second logic level and detecting a logical transition of an input signal on the input node, activate the output stage to drive an output signal on the output node. A storage element is configured to capture a logic value of the input signal when the clock is at the second logic level and to store the logic value, and to provide the output signal on the output node when the clock signal is at the first logic level.

19 Claims, 10 Drawing Sheets

TRANSIT STATE ELEMENT

BACKGROUND OF THE INVENTION

1. Field of the Invention

This invention relates to electronic circuits, and more particularly repeater circuits and transit state elements.

2. Description of the Related Art

As integrated circuit (IC) technology advances, the speed at which IC's operate increases while operating voltages generally decrease. As such, the distance at which signals must propagate on a die become an increasingly important factor to consider in IC design. At longer distances, on-die interconnects between a transmitter and a receiver can develop enough resistance and enough capacitance that the signal transition at the receiver can be adversely affected. Excessive propagation delay across a long signal interconnect can affect the transition at the receiver in terms of both timing and voltage levels. For example, a signal that propagates too slowly across an interconnect may in some cases not allow sufficient set-up and hold time for the receiver to properly transition from one logic level to another. Furthermore, a slow transition can cause crowbar currents in some receivers, which can lead to increased power consumption and may further lead to circuit damage in more severe cases.

In order to combat the negative effects of long signal interconnects, repeater circuits may be implemented. More particularly, repeater circuits may be placed along a signal path between a transmitter and receiver, effectively breaking a single interconnect into two interconnects. In such a configuration, a repeater circuit may overcome some of the problems of resistance and capacitance that would be present in a single signal interconnect, and may further cause faster transition times at the receiver.

Repeater circuits may be simple or complex. The simplest interconnect circuits may be implemented using an inverter, with a double inverter (i.e. a buffer) being an alternative if no logical inversion is desired. A more complex repeater circuit is shown in FIG. 1. Repeater circuit 10 may be referred to as a static-dynamic repeater circuit, as certain devices of the change states once in a given cycle (i.e. turn on or turn off responsive to an input transition), while certain other ones of the devices operate dynamically within the given cycle (i.e. turn on and then off responsive to an input transition).

Consider an example when the output of repeater circuit 10 is initially low and a signal on the input transitions from a logic low ('low') to a logic high ('high'). Just prior to the transition, the output of inverter I5 will be high, which results in a high on the respective gate terminals of transistors N2 and N4, while transistors P2 and P4 are off. When the signal on the input transitions high, transistors N1 and N3 will turn on. Since a high was already present on the gate terminal of transistor N2 on prior to the transition, both N1 and N2 will be active and thus provide a pull-down path to ground from Node 1. The pull-down of Node 1 results in the turning on of transistor P3, which in turn results in a pull-up path between the output node and VDD. Thus, the pull-up path provided by transistor P3 causes the output node to be pulled high, and this may occur prior to the input signal propagating through inverters I1 and I2.

After the output node is pulled high, the high is fed back through the feedback path that includes the inverter chain of I3, I4, and I5. This eventually results in a logic low on Node 3, which turns on transistor P2, while turning off transistor N2. When transistor P2 is active, a pull-up path is provided from Node 1 to VDD. Thus, Node 1 is pulled high, transistor P3 is turned off and therefore no longer drives the output node. However, the feedback chain comprising inverters I3-I5 may be designed such that the amount of delay it provides is greater than the amount of delay through the keeper comprising I1 and I2, and thus the output node remains high even after P3 is turned off. The other output device, N5, remains turned off (since node 2 is pulled low through transistor N3), and will not turn on until after the signal on the input node transitions from a high to a low. After transistor P3 turns off, the logic high is held on the output of inverter I2.

Thus, transistor P3 is a dynamic device in this particular circuit, since it turns on and then off responsive to an input signal transition from low to high. Similarly, N5 is also a dynamic device that will turn on and then off responsive to an input signal transition from high to low. Other devices, such as transistors P1, P5, N1, and N3, are considered static devices in this circuit, as they turn on or turn off only once in a cycle in which an input signal transition occurs.

The use of repeater circuit 10 may provide certain advantages over simpler repeater circuits, such as the aforementioned buffers and inverters. For example, repeater circuit 10 may be less susceptible to crowbar currents than a buffer or an inverter. Furthermore, power consumption may be reduced, since the output devices (which are typically much larger than other devices in the circuit) do not drive the output for the entire cycle. Instead, the output devices may provide sufficient drive to overcome the resistance and capacitance inherent in the signal interconnect long enough to enable a timely transition at the receiver, and then turned off once the output is present on the output of inverter I2.

In some cases, the distance between a transmitter and a receiver may be such that, even using repeater circuits, the signal propagation delay crosses a cycle boundary. That is, the signal propagation delay is greater than one clock cycle or long enough that it will not allow a receiver sufficient setup and hold time, regardless of whether or not repeater circuits are present. In such a case, it is necessary to capture the signal state in one clock cycle and forward it in the next. However, this problem may be overcome by adding a flip-flop or a latch in series with the repeater circuit.

SUMMARY OF THE INVENTION

A transit state element circuit is disclosed. In one embodiment, the transit state element circuit includes a clock input stage coupled to receive a clock signal, wherein the clock signal alternates between a first logic level and a second logic level. The transit state element circuit further includes an output stage configured to drive an output signal on an output node and an activation stage coupled to an input node, wherein the activation stage is configured to, responsive to the clock input stage detecting a transition from the first logic level to the second logic level and detecting a logical transition of an input signal on the input node, activate the output stage to drive an output signal on the output node. The activation stage is configured to inhibit the output stage from activation when the clock signal is at the first logic level The transit state element further includes a storage element configured to capture a logic value of the input signal when the clock is at the second logic level, store the logic value of the input signal after the clock signal transitions to the first logic level, and to provide the output signal on the output node when the clock signal is at the first logic level.

In one embodiment, the activation stage includes a first activation circuit coupled to the input node and a second activation circuit coupled to the input node, while the output stage includes a first output circuit coupled to the first activation circuit and the output node, and a second output circuit coupled to the second activation circuit and the output node. The first activation circuit is configured to activate the first output circuit and the first output circuit is configured to drive the output signal on the output node at the second logic level responsive to the input signal and the clock signal transitioning to the second logic level. The second activation circuit is configured to activate the second output circuit and the second output circuit is configured to drive the output signal on the output node at the first logic level responsive to the input signal transitioning to the first logic level and the clock signal transitioning to the second logic level. The first activation circuit is further configured to inhibit activation of the first output signal when the second output circuit is activated, while the second activation circuit is configured to inhibit activation of the second output circuit when the first output circuit is activated.

A method for operating a transit state element circuit is also disclosed. In one embodiment, the method includes receiving a clock signal, wherein the clock signal alternates between a first logic level and a second logic level, detecting a logical transition of an input signal on an input node, and activating an output stage responsive to the clock signal transitioning to the second logic level and said detecting the logical transition. Responsive to said activating, the method includes driving an output signal on an output node. The method further includes capturing, in a storage element, a logic value of the input signal responsive to the clock signal transitioning to the second logic level. The output stage is deactivated responsive to the clock signal transitioning from the second logic level to the first logic level. The method further includes storing, in the storage element, the logic value of the input signal subsequent to the clock signal transitioning from the second logic level to the first logic level and providing the output signal, from the storage element, subsequent to the clock signal transitioning from the second logic level to the first logic level.

BRIEF DESCRIPTION OF THE DRAWINGS

Other aspects of the invention will become apparent upon reading the following detailed description and upon reference to the accompanying drawings in which.

Figure 1:
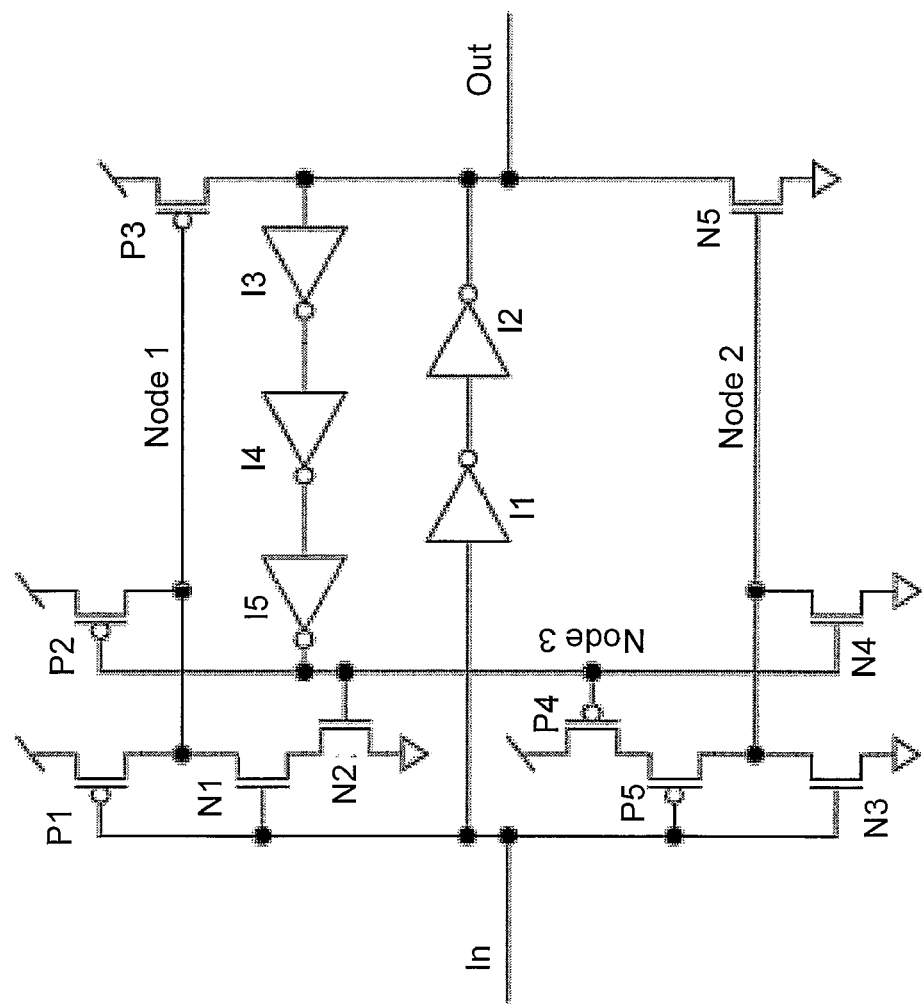
FIG. 1 (prior art) is a schematic diagram of one embodiment of a repeater circuit.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Static-Dynamic-Dynamic Repeater Circuit

Figure 2:
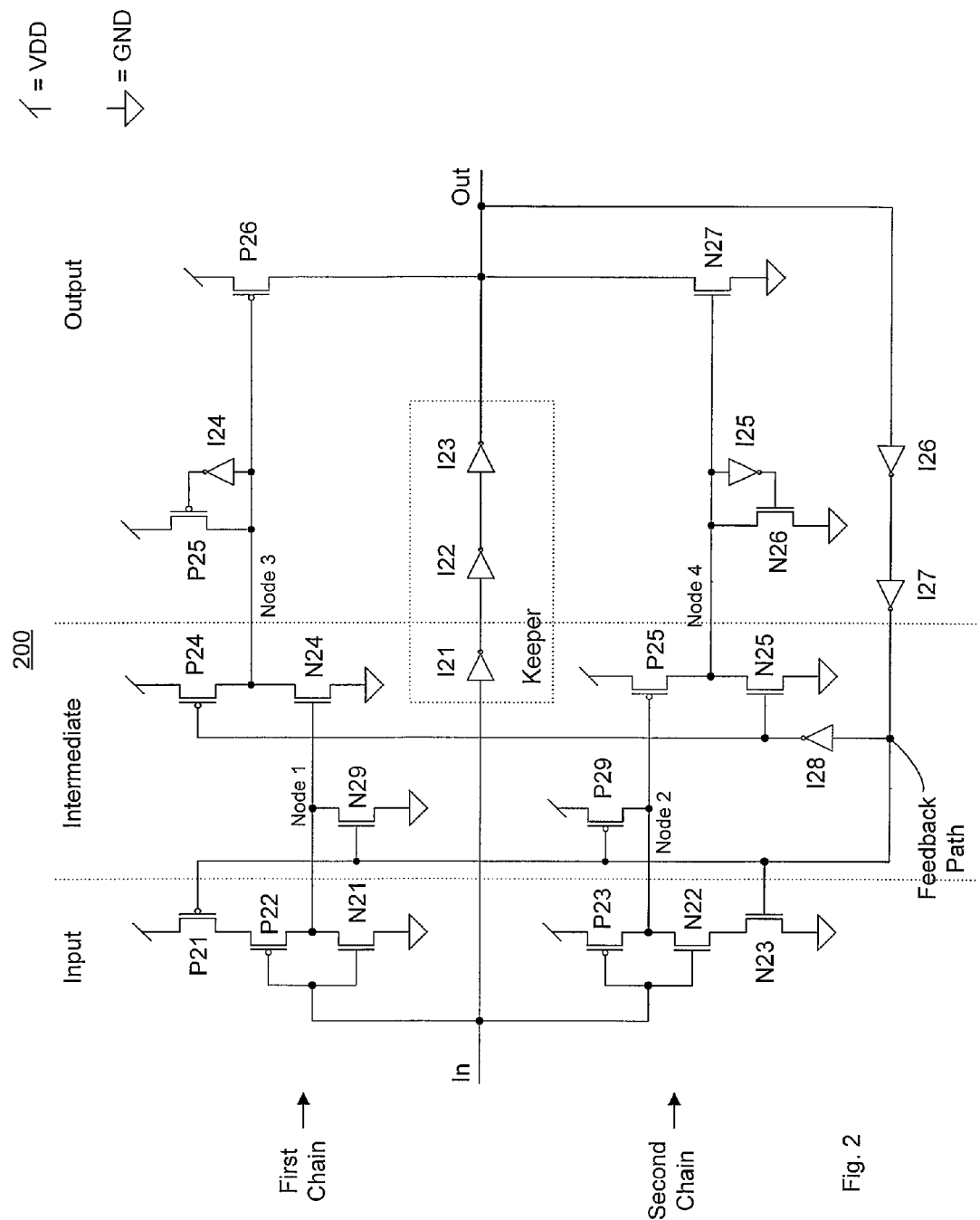
FIG. 2 is a schematic diagram of one embodiment of a static-dynamic-dynamic (SDD) repeater circuit.

Turning now to FIG. 2, a schematic diagram of one embodiment of a static-dynamic-dynamic (SDD) repeater circuit is illustrated. In the embodiment shown, circuit 200 includes a first chain (upper portion of the circuit) and a second chain (lower portion of the circuit), and can further be divided into an input stage, an intermediate stage, and an output stage. As will become clear from the explanation below, the circuit in the embodiment of FIG. 2 may be referred to as a static-dynamic-dynamic repeater circuit, since it includes, in each chain, one static stage (i.e. switches only once responsive to an input signal transition) and two dynamic stages (switches on and then, after a delay, switches off responsive to an input signal transition). Circuit 200 also includes a keeper (comprising inverters I21, I22, and I23 in this embodiment) and a split feedback path (which includes inverters I26 and I27 in this embodiment, and also includes inverter I28 after the split).

It should be noted that throughout this disclosure, transistors that are designated with a 'P' (e.g., P21) are PMOS transistors, while transistors designated with an 'N' (e.g., N21) are NMOS transistors.

In the embodiment shown, the dynamic portions of circuit 200 are configured such that they are activated by a corresponding logical transition of an input signal on the input node ('In'). Consider the case when the input signal transitions from a logic low to a logic high. Just prior to the transition, the output node ('Out') will be at a logic high level due to the fact that this embodiment of a repeater circuit is configured to perform a logical inversion of the input logic value (although non-inverting embodiments are possible and contemplated). The logic high on the output node results in a logic high on the gate terminals of transistors N29 and N23. Transistor N29 is active due to the logic high on its gate terminal, and thus Node 1 is pulled low. Transistor N24 is held inactive as a result of Node 1 being pulled low, which further results in transistor P26 being inactive.

In the embodiment shown, a low-to-high transition on the input node results in a high-to-low transition on the output node through operations in the lower portion ('Second Chain') of the circuit. Responsive to the low-to-high transition of the input signal, transistor N22 is activated, while N23 will also become active since there is a logic high on its gate terminal. Thus, with both N22 and N23 in the active state, Node 2 is pulled low (to ground). As a result of Node 2 being pulled low, P25 is activated, which in turn results in Node 4 being pulled high (to VDD). The high on Node 4 is held in this embodiment by a weak keeper that includes N26 and inverter I25. With Node 4 pulled high, output stage transistor N27 is activated, and thus drives a logic low on the output node.

Concurrent with the operations described in the previous paragraph, the first chain inhibits activation of P26. As noted above, prior to the low-to-high transition on the input node, transistor N29 is active, which prevents the activation of N24 and thus P26. Responsive to the low-to-high transition, transistor N21 becomes active. Thus, Node 1 is pulled low through both N21 and N29, and will continued to be pulled low through the former after N29 is deactivated, which will be explained below.

After the output node is driven low by output transistor N27, the low is propagated as a first feedback signal into the feedback path. Inverters I26 and I27 provide delay in the feedback path, with I28 providing additional delay in a portion of the feedback path after the split. The output of I27 follows the output node, and is thus also a logic low in this example. The logic low from the output of I27 is propagated to the gate terminals of transistors N23, P29, N29, and P21. As such, transistors P21 and P29 become active, while transistors N23 and N29 become inactive. Although N29 becomes inactive as a result of the propagation of the logic low from I27, Node 1 continues to be pulled low through N21 due to the logic high on the input node. However, the logic low propagated from I27 causes P29 to become active and N23 to become inactive. Thus, Node 2 is pulled high responsive to the propagation of the logic low from I27, after initially being pulled low responsive to the low-to-high transition on the input node. Pulling Node 2 high results in the deactivation of P25. Thus, when P25 is inactive, the pull up path from Node 4 to VDD through this device is cut off.

As previously noted, the feedback path of circuit 200 is split into two paths on the output node of I27. One of these paths leads to inverter I28, the output of which is coupled to transistors N25 and P24, while the other path leads to N23, P29, N29, and P21. When the first feedback signal is a logic low, a second feedback signal is provided as a logic high on the output of I28. The logic high output by I28 causes the activation of N25 and deactivation of P24. The deactivation of P24 results in all three devices of the first chain portion of the intermediate stage, N24, P24, and N29 being inactive.

In the second chain portion of the intermediate stage, the logic high output from I28 causes the activation of transistor N25, thereby providing a pull down path for Node 4. Both transistors N25 and P25 are sized such that they provide sufficient drive strength to override the keeper comprising I25 and N26. Thus, the activation of N25 results in Node 4 being pulled and held low, thereby deactivating N27. However, even though N27 is inactive at this point, the logic low on the output node is held by the keeper circuit comprising inverters I21, I22, and I23. At this point of operation in circuit 200, none of the devices will change state again until there is a logical transition of the input signal on the input node.

Now consider the case when the input signal transitions from a logic high to a logic low. Prior to the transition, a logic low is present on the output node. As a consequence of the logic low on the output, a logic low is present on the gate of P21 and N23. When the input signal falls low, transistor P23 is activated, thereby pulling Node 2 high, which prevents activation of P25 and thus N27. The low on the input node also results in P22 becoming active, thereby resulting in a pull up path between VDD and Node 1 (through P22 and P21). As a result of Node 1 being pulled high, transistor N24 is activated, thereby providing a pull down path from Node 3 to ground. Thus, when active, N24 drives a logic low on Node 3, providing enough drive strength to override a high value that might otherwise be held by the keeper circuit that includes I24 and P25. The logic low on Node 3 further results in the activation of output transistor P26, which then drives a logic high value on the output node.

The logic high driven by P26 on the output node is also propagated into the feedback path. After a delay, a logic high will be present on the output of I27, and thus on the gate terminals of N23, P29, N29, and P21. As a result, transistors P29 and P21 become inactive, while N29 is activated. With N29 active and P21 inactive, Node 1, previously pulled high, is now pulled low (through N29). This results in the deactivation of N24. The logic high on the output of I27 is propagated into the split portion of the feedback path including I28, where it is inverted into a logic low. This logic low appears on the gate terminals of N25 and P24. Transistor N25 is deactivated as a result, and the logic low on Node 4 is held by the keeper circuit coupled thereto. Transistor P24 becomes active at this point, which results in Node 3 being pulled high (with P24 overriding the keeper coupled thereto), thereby deactivating P26. After deactivation of P26, the logic high on the output node continues to be provided by the keeper via the output of I23. During this transition, each of N25, P25, and P29 become inactive, thereby inhibiting N27.

In implementing a repeater circuit in accordance with that shown in FIG. 2, it may be important to consider the device sizes (more particularly, the channel widths) of the various transistors. Consider 'x' to be a unit size for a transistor; exemplary device sizes for one implementation of circuit 200 may be as follows:

P26=156x; N27=120x; N26=2x; P25=2x; P24=6x; N24=17x; P25=17x, N25=3.3x; P29=2x, N29=2x; P21=4.8x; P22=4.8x; N21=2x; P23=2x, P23=2x, N22=4x, N23=4x; I21=2x/2x (PMOS/NMOS); I22=4x/3x; I23=16x/12x; I24-I28=2x/2x.

Broadly speaking, the larger devices provide greater drive strength than their smaller counterparts. Thus, output transistors P26 and N27 provide a significant amount of drive strength, which may enable the repeater circuit having reduced sensitivity to resistance and capacitance (RC sensitivity) on wire connected to the output. This may enable the repeater circuit to be used with longer wires, and may also result in faster transition times at the far end (i.e. at the receiver circuit coupled to the output of the repeater). It should be noted that the transistor sizes given above are exemplary, and may vary from one embodiment to another. Transistor sizes may be selected based on factors such as the amount of drive strength needed, power requirements, switching speed requirements, and so forth.

In various embodiments of circuit 200, transistor voltage switching thresholds may be chosen to provide faster switching speed and to reduce sensitivity to resistance and capacitance on the wire coupled to the input and output sides. In one embodiment, the transistors may have switching thresholds at ⅓ VDD rising and ⅔ VDD falling. This may enable the input stages to switch faster responsive to a logical transition of the input signal, which may increase the overall operating speed of the circuit. Furthermore, utilizing devices with switching thresholds such as those used in this example may help to minimize or eliminate crowbar currents that may otherwise occur. Switching thresholds may also be varied from one embodiment to the next to control delay within the circuit. The delay of various devices in both the forward chains and feedback path may be chosen such that the output devices are turned on for a sufficient amount of time to effectively drive the far end transition over the wire connected to the output, and subsequently turned off fast enough to minimize power consumption.

The static-dynamic-dynamic repeater circuit shown in FIG. 2 is but one possible embodiment of such a circuit. Generally speaking, such a circuit may be implemented in various arrangements that include the input stage, the intermediate stage, and the output stage (divided into two circuit chains), and further includes a feedback path. The circuit configurations for the stages shown herein represent one possible embodiment for each. However, it is contemplated that these stages may be implemented using other suitable circuit configurations. In the various embodiments possible of such a circuit, an input circuit of one chain is a static circuit that activates a corresponding intermediate circuit, which in turn activates a corresponding output circuit. A feedback path is provided from the output circuit to the intermediate circuit, which is configured to respond to a feedback signal received therefrom in order to deactivate its corresponding output circuit. A static is keeper circuit is configured to maintain the output signal value between transitions. Thus, while FIG. 2 illustrates one such embodiment of such a static-dynamic-dynamic repeater circuit, other circuit arrangements that perform in this manner are possible and contemplated within the scope of this disclosure. It should also be noted that while the embodiment shown in FIG. 2 provides an output signal that is inverted from its input value, non-inverting embodiments are also possible and contemplated.

Figure 3:
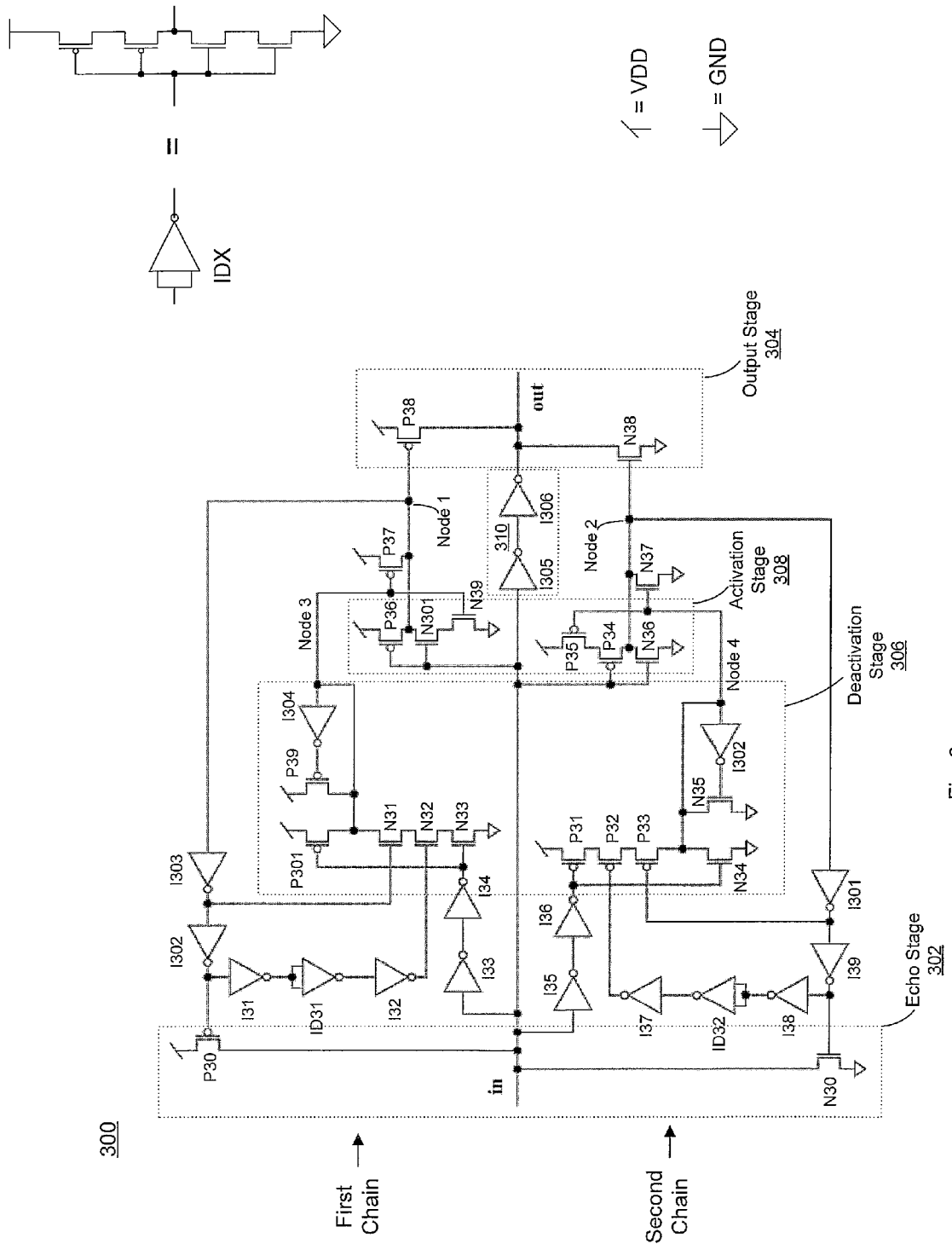
FIG. 3 is a schematic diagram of one embodiment of an active echo repeater circuit.

Echo Repeater Circuits:

Another type of a repeater circuit is known as an active echo repeater circuit. FIG. 3 is a schematic diagram of one embodiment of such an active echo repeater circuit. In the embodiment shown, an echo stage 302 is provided, which assists the transition of an input signal from a low level to a high level, or vice versa. Thus, circuit 300 may exhibit reduced RC sensitivity to wires connected to its input as well as to its output. Furthermore, the use of the echo stage may result in faster transition times with respect to other embodiments that do not incorporate such circuitry.

It is noted that some inverters in circuit 300 (as well as some of the other circuits disclosed herein) include two PMOS and two NMOS devices, instead of a single PMOS and single NMOS, as is typical of many inverters. This configuration is shown as IDX in the upper right hand corner of the drawing. Accordingly, inverters designated as "ID" (e.g., ID31) are of the same configuration as IDX. Such an inverter configuration may provide a higher input capacitance and lower drive and may thus generate delay more efficiently than the typical inverter configuration having only one PMOS device and one NMOS device.

In the embodiment shown, circuit 300 includes the aforementioned echo stage 302, an output stage 304, an activations stage 308, a deactivation stage 306, and a keeper 310, as well as various additional devices that will be explained in further detail below. In this particular embodiment, a low-to-high transition on the input activates devices in the first chain, while a high-to-low transition on the input activates devices in the second chain. Activation stage 308 in this embodiment is a static stage (that is, the devices in a given chain switch only once responsive to a corresponding input transition). Output stage 304, echo stage 302, and deactivation stage 308 are dynamic stages, as each includes devices that switch twice in a given chain responsive to a corresponding input transition. It is also noted that circuit 300 is a non-inverting repeater, although inverting embodiments are possible and contemplated.

For a given circuit chain in the embodiment shown, activation stage 308 is configured to activate the corresponding output stage 304, responsive to a corresponding logic transition on the input node (e.g., the first chain activates responsive to a low-to-high transition on the input node). Echo stage 302 is configured to be activated responsive to activation of output stage 304 (at a delay time thereafter in the embodiment of FIG. 3). Deactivation stage 306 is configured to deactivate output stage 304 at a delay time subsequent to its activation. Echo stage 302 is configured to be deactivated responsive to the deactivation of output stage 304. Keeper circuit 310 is configured to provide a continuous output signal subsequent to deactivation of output stage 304. The circuit is further configured such that none of the dynamic stages (e.g., output stage 304, echo stage 302) are activated if no change on the input occurs from one cycle to the next. Circuit 300 is one possible implementation of a repeater circuit that includes an activation stage, an output stage, an echo stage, and a deactivation stage, although other embodiments are possible and contemplated.

Consider the case where the input signal transitions from a logic low to a logic high. Prior to the transition, the output signal on the output node will be at a logic low, while Node 1 is at a logic high and Node 2 is at a logic low. In the first chain, logic low levels are present on the gate terminals of transistors P301 and P39 just prior to the transition, while logic high levels are present on the gate terminals of transistor N39 in the first chain and transistor N35 in the second chain. When the input signal transitions high, transistor N301 is turned on, and thus Node 1 is pulled low through N301 and N39. As a result, transistor P38 of output stage 304 is activated, and thus the output node is pulled high. The logic high on Node 1 is also propagated through inverters I302 and I303 to the gate terminal of echo device P30. Thus, echo device P30 becomes active subsequent to P38 becoming active, after a delay determined by I302 and I303. When active, P30 pulls the input node high toward its full logic high level. Accordingly, activating echo device P30 may assist the low-to-high transition by causing it to occur faster while reducing the RC sensitivity of the signal path coupled to the input node. It is noted, however, that various devices such as N301 may have switching thresholds at less than full-rail levels, e.g., ⅓ VDD rising and ⅔ VDD falling (others may have different thresholds as will be discussed below). Thus, prior to activating P30, the input signal, while in the process of transitioning high, may be at a level significantly below the full logic high level.

Each of the first and second chains of circuit 300 include a feedback path (which is split in this embodiment) and a feed-forward path. In the embodiment shown, the feedback path in the first chain originates at Node 1. The feedback path is split at the output of I303, and is split a second time at the output of I302. The gate terminal of transistor P30 is coupled to the output of I302. Thus P30 becomes active when a logic low on Node 1 has propagated through both I303 and I302, as noted above. Subsequent to Node 1 falling low (and responsive thereto), the output of I303 transitions high, resulting in a logic high on the gate of N31. At a delay time after the output of I303 transitions high (determined by the cumulative delay provided by I302, I31, ID31, and I32), the output of I32, which is coupled to the gate terminal of N32, transitions high. Meanwhile, the transitioning of the input signal from low to high propagates through the feed-forward path comprising inverters I33 and I34, thereby resulting in a high on the gate terminals of P301. At this point, P301 becomes inactive, while transistors N31, N32, and N33 of deactivation stage 306 become active and provide a pull down path for Node 3. The high stored on Node 3 by the keeper circuit of I304 and P39 is thus overridden and the node pulled low through the pull down path. As a result, N39 is deactivated while P37 becomes active. When P37 becomes active, Node 1 is provided a pull up path to VDD is provided, and thus Node 1 is pulled high. Transistor P38 becomes inactive responsive to Node 1 being pulled high, although the output signal is provided a high by I306 of keeper 310. The high level on Node 1 eventually results in the deactivation of P30 due to a high level on its gate node. Through the split feedback path, the outputs of I303 and I32 eventually fall low, thereby causing the deactivation of N31 and N32, respectively. However, the logic low is held on Node 3 by the keeper of I304 and P39.

Transistor N36 of activation stage 308, second chain, is activated responsive to the low-to-high transition, providing a pull down path for Node 2. Through the feed-forward path of the second chain (I35 and I36), N34 is activated responsive to a logic high on its gate terminal, thereby overriding the keeper of N35 and I302, and pulling Node 4 low. As a result of Node 4 being pulled low, N37 is deactivated, while P35 becomes active. However, the low on Node 2 remains due to the active state of N36, while P34 remains inactive.

Responsive to the input signal falling low, N36 becomes inactive while P34 is activated. Since a logic high was present on the gate terminal of P35 responsive to the low-to-high transition of the input signal, the activation of P34 results in a pull up path from Node 2 to VDD through P34 and P35. Thus, Node 2 is pulled high, N38 becomes active as a result thereof. When active, output device N38 drives a logic low on the output node. Furthermore, the logic high on Node 2 is propagated into the feedback path, through I301 and I39 to the gate terminal of N30. As a result, N30 becomes active, and drives a logic low on the input node, thereby assisting the high-to-low transition of the input signal. The logic high propagated onto the feedback path also results in a logic low on the gate of P33 (via the output of I301) and a logic low on the gate of P32 (via the output of I37). The high-to-low transition also propagates through the feed forward path of I35 and I36, thereby resulting in a logic low on the gate terminals of N34 and P31. As a result, N34 becomes inactive, while the logic low levels on the gate terminals of P31, P32, and P33 causes these devices to become active, thereby providing a pull up path from Node 4 to VDD. The pull up path results in a logic high on Node 4, overriding the logic low previously held by the keeper of I302 and N35. The logic high on Node 4 further results in the activation of N37 and deactivation of P35. The activation of N37 results in a pull down path between Node 2 and ground. Thus, when Node 2 is pulled low, N38 becomes inactive and discontinues driving the logic low on the output node. Transistors P32 and P33 are deactivated responsive to Node 2 being pulled low at respective delay times subsequent thereto. However, a logic high is held on Node 4 by the keeper circuit to which it is coupled.

In the first chain, the high-to-low input transition results in the activation of P36, while N301 becomes inactive. The low from the input will also propagate to the output of I34, which results in the activation of P301 (while N33 is held inactive). When P301 becomes active, the low previously held by the keeper coupled to Node 3 is overridden, resulting in the deactivation of P37, and logic high is provided to the gate terminal of N39.

As with the circuit shown in FIG. 2, the various devices in circuit 300 may be sized to provide sufficient drive for their respective functions. For example, output device P38 may be sized at 100x, while output device N38 is sized at 50x. In the echo stage, echo device P30 may be sized at 8x, while echo device N30 is sized at 4x. However, the sizes of the devices in the circuit may vary from one implementation to the next in accordance with various requirements (e.g., required drive strength, power consumption limitations, etc.).

It should be nodded that while some devices have switching thresholds at, e.g., ⅓ VDD rising and ⅔ VDD falling, some devices in the circuit may have different switching thresholds. For example, devices in the feed forward paths (I33 and I34 in the first chain, I35 and I36 in the second chain) may switch at less than ⅓ VDD rising and greater than ⅔ VDD falling. This may be necessary in some embodiments to prevent oscillation of the circuit. Voltage thresholds may also vary among the devices of a given circuit in order to ensure the proper amount of delay is present (e.g., such as in the feedback chain). In general, threshold values may be varied according to the specific implementation in order to ensure correct circuit operation. It is also noted that the output and echo devices of circuit 400 may be the same as their respective counterparts in circuit 300, but may also be different in other implementations.

Figure 4:
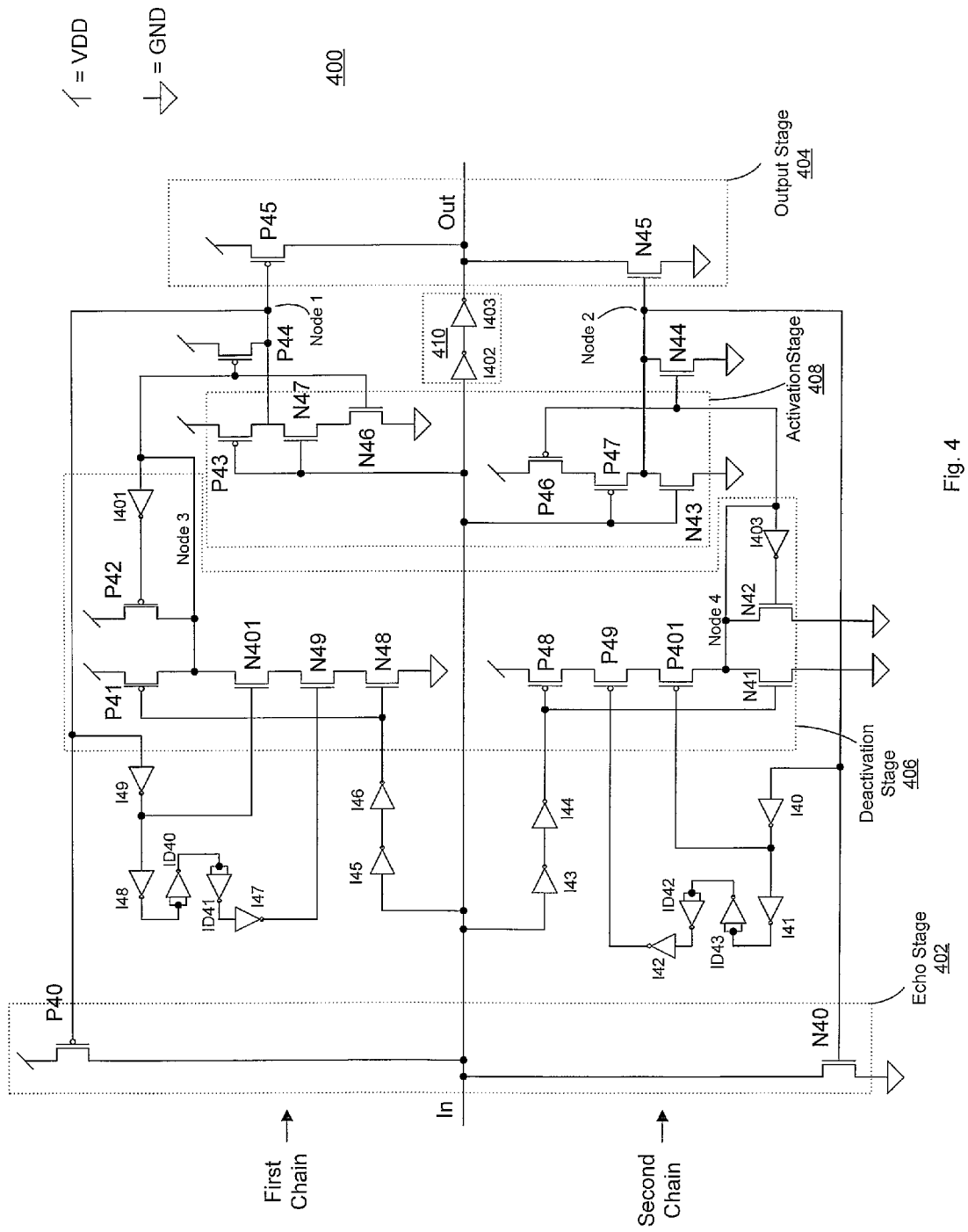
FIG. 4 is a schematic diagram of one embodiment of a fast active echo repeater circuit.

Another embodiment of an echo repeater circuit is shown in FIG. 4. More particularly, circuit 400 is a fast echo repeater circuit. Circuit 400 is similar in operation and function to echo repeater circuit 300 shown in FIG. 3. However, in this embodiment the gate terminals of the echo devices are coupled to the same nodes as their respective output devices. Thus, the gate terminals of both output device P45 and echo device P40 are coupled to Node 1, while the gate terminals of output device N45 and echo device N40 are coupled to Node 2. Thus, when a given output device is activated in this embodiment, its corresponding echo device is also activated without any substantial delay. Accordingly, the input transition in this particular embodiment may occur faster than in the embodiment shown in FIG. 3. The remainder of circuit 400 functions the same as circuit 300, with the feedback paths for the first and second chains originating at Nodes 1 and 2, respectively.

Figure 5:
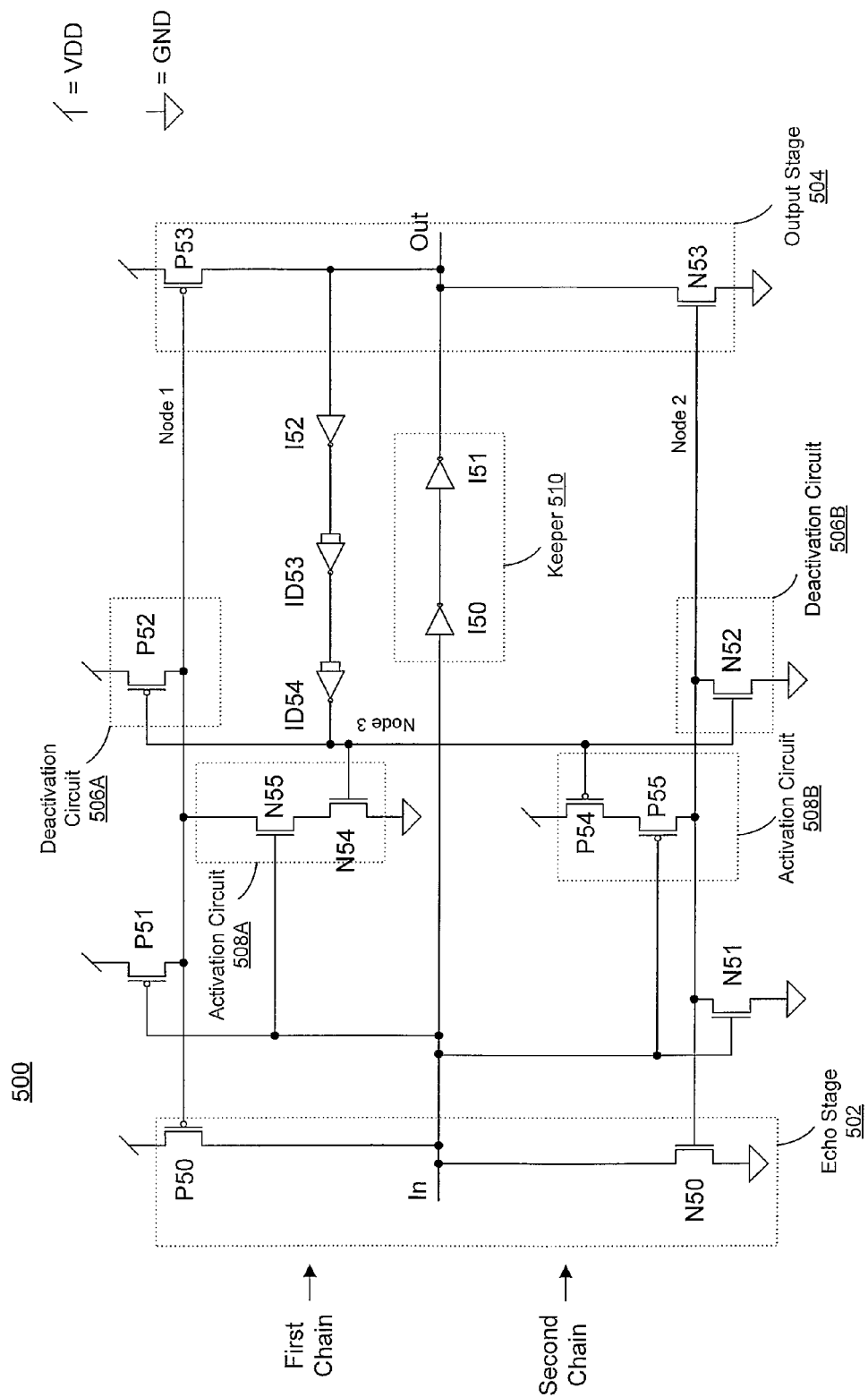
FIG. 5 is a schematic diagram of another embodiment of a fast active echo repeater circuit.

Yet another embodiment of a fast active echo repeater circuit is shown in FIG. 5. In this particular embodiment, the activation stage of circuit 500 is implemented via activation circuits 508A and 508B, while the deactivation stage is implemented via deactivation circuit 506A and 506B. Circuit 500 is also differentiated from circuits 300 and 400 in that it includes only a single, non-split feedback path.

In the case where the input signal transitions from a logic low to a logic high, just prior thereto the output node is at a logic low, while Node 3 is at a logic high. Thus, each of transistors P52, N54, P54, and N52 have a logic high on their respective gate terminals. When the input signal transitions high, the high propagates to the gate of N55. Thus, since the gate of N54 is also high at this point, N54 and N55 become active and provide a pull down path between Node 1 and ground. Accordingly, Node 1 is pulled low and P53 is activated responsive thereto. When active, P53 drives a logic high on the output node. Since the embodiment shown is an echo repeater circuit, P50 also becomes active responsive to the low on Node 1, driving a logic high on the input node and thereby assisting the transition of the input signal. The low-to-high transition on the input node also results in the activation of N51 in the second chain, which in turn pulls Node 2 low an thus ensures that N53 is inhibited from activation.

Subsequent to the activation of P53, the resulting logic high on the output node is propagated into the feedback chain that comprises I52, ID53, and ID54 in this embodiment. After the effect of the low-to-high transition of the output node has propagated through the feedback chain, the output of ID54 falls low, thereby activating P52, while deactivating N54. When P52 becomes active, Node 1 is pulled high, and thus output device P53 and echo device P50 become inactive. After P53 has been deactivated, keeper 510 continues to provide the logic high on the output node. The low output from ID54 is also propagated to the gate terminal of P54.

When the input signal falls low again, the logic low is propagated to the gate terminals of N51 and P55. Transistor N51 is deactivated as a result. Since the previous transition of the output signal to a logic high resulted in a logic low on the gate of P54 (via Node 3), both P54 and P55 become active as a result of the input signal falling low. The activation of P54 and P55 provides a pull up path between Node 2 and VDD.

Thus, Node 2 is pulled high, thereby causing the activation of output device N53. When active, N53 drives a logic low on the output node. The logic low on the output node is also propagated into the feedback chain, where I54 provides, after a delay, a logic high on Node 3. As a result of the high on Node 3, N52 becomes active, providing a pull down path between Node 2 and ground. When Node 2 falls low as a result, N53 becomes inactive, and thus the low on the output node is provided only by I51 at this point.

Output devices P53 and N53 may be sized similar to their respective counterparts in FIGS. 3 and 4. Furthermore, transistors having thresholds at ⅓ VDD rising and ⅔ VDD falling may be used where appropriate in this circuit, while transistors having thresholds inside or outside of this range may also be used if necessary.

Figure 6:
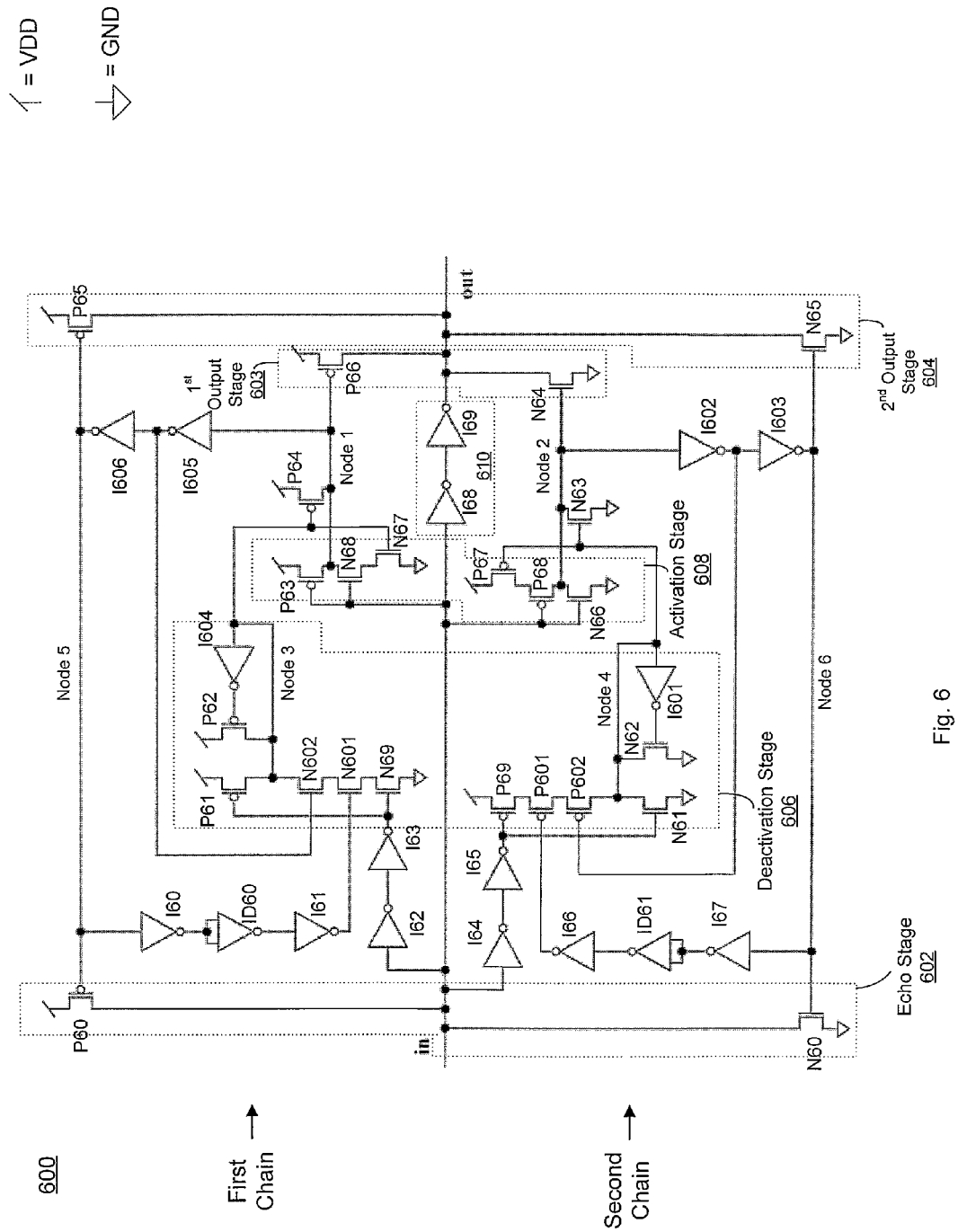
FIG. 6 is a schematic diagram of one embodiment of an echo repeater circuit having a staged output.

A schematic diagram of one embodiment of an echo repeater circuit having a staged output is shown in FIG. 6. In the embodiment shown, circuit 600 is similar to circuit 300, particularly in echo stage 602, deactivation stage 606, and activation stage 608, which function in largely the same manner as their counterparts in circuit 300. However, unlike circuit 300, circuit 600 includes two output stages, a first output stage 603 and a second output stage 604. It is noted that embodiments having a staged output without an echo stage are also possible and contemplated.

Just prior to a low-to-high transition on the input node, Node 3 is at a logic high, and thus so is the gate terminal of N67. Responsive to a low-to-high transition on the input node, both N67 and N68 will be active, providing a pull down path between Node 1 and ground. When Node 1 is pulled low, P66 becomes active and begins driving a logic high on the output node. In this particular embodiment, P66 is sized at 50x, although the device size for a given implementation may be chosen in accordance with its specific requirements. The logic low on Node 1 is also provided to the inverter chain including I605 and I606. This eventually results in a logic low on Node 5 at a delay time subsequent to the logic low appearing on Node 1. When Node 5 falls low, output device P65 (also sized at 50x in this embodiment) and echo device P60 (sized at 8x in this embodiment) are activated, driving logic highs on the output and input nodes, respectively. Output device P66 is subsequently deactivated by the first chain portion of deactivation stage 606 in the same manner as described above with reference to FIG. 3. Output device P65 and echo device P60 are deactivated at the delay time subsequent to the deactivation of P66.

Similarly, when the input signal undergoes a high-to-low transition, a logic high will result on Node 2 as a result of the pull up path provided when both P67 and P68 are active. This results in the activation of output device N64 (25x), and at a delay time subsequent thereto, the activation of N65 (25x) and N60 (4x). Output device N64 is subsequently deactivated by the second chain portion of deactivation stage 606, with the deactivation of output device N65 and echo device N60 following at a delay time later.

Implementing a repeater circuit having a staged output as circuit 600 may be useful in situations when it is desirable to minimize noise in the power distribution system. But staging the output response in the manner described herein, the change in current (di/dt) may be reduced, thereby reducing the circuit causing noise in the power distribution system. Such a circuit arrangement may also reduce input capacitance and thus improve propagation time.

Generally speaking, each of the echo repeater circuits discussed herein includes an activation stage, a deactivation stage, at least one output stage, an echo stage, and some form of feedback. These stages may be implemented in various circuit configurations, and are not limited to the specific configurations shown herein. The activation stage is configured to sense an input transition and activate at least one of the output stages (with subsequent output stage activations possible in staged output embodiments). The echo stage is also activated responsive to the activation stage activating the at least one output stage. After activation of the one or more output stages, a deactivation stage receives feedback signals, after a delay, and deactivates at least one of the output stages, with any additional output stages becoming inactive as a result thereof. The various circuits that accomplish these functions as discussed above are exemplary, as many other embodiments of such circuits that may accomplish these functions are possible and contemplated. Furthermore, as previously noted, embodiments having multiple output stages such as that shown in FIG. 6 implemented without an echo stage are also possible and contemplated.

Figure 7:
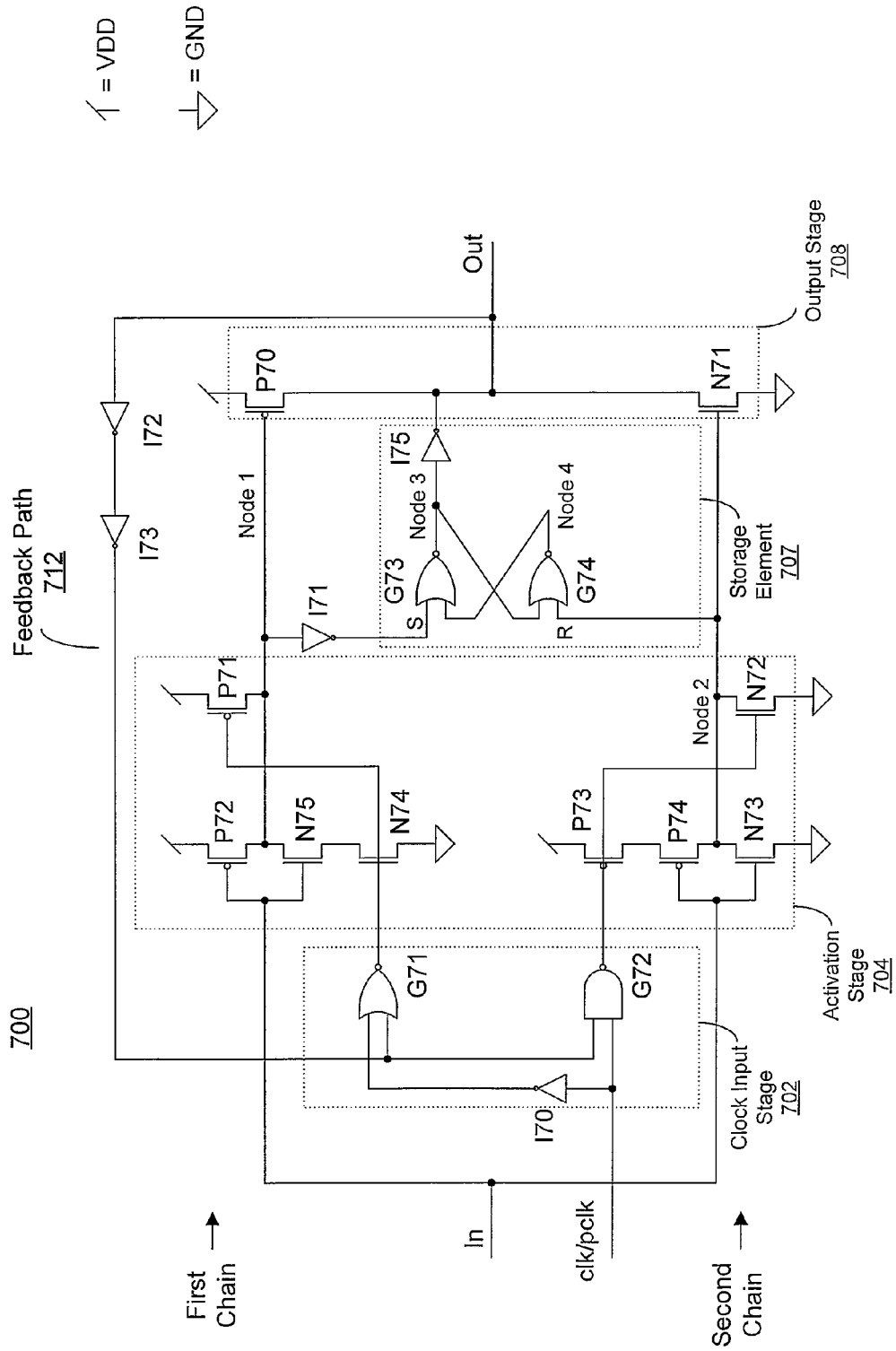
FIG. 7 is a schematic diagram of one embodiment of a transit state element circuit that incorporates the functions of a repeater and a state element.

Transit State Elements:

FIG. 7 is a schematic diagram of one embodiment of a transit state element circuit that incorporates the functions of a repeater and a state element. Circuit 700 may be useful in situations where a signal propagation delay time crosses a cycle boundary (i.e. the propagation time exceeds the period of a clock cycle). As such, the signal value may be captured and stored in one clock cycle before being conveyed to its destination (or another transit state element) in the next clock cycle.

In the embodiment shown, circuit 700 includes a clock input stage 702, an activation stage 704, a storage element 707, an output stage 708, and a feedback path 712. Clock input stage 702 in this embodiment includes inverter I70 and logic gate G71 (NOR) and G72 (NAND). When implemented on an integrated circuit, clock input stage is coupled to receive a clock that may either be a level clock signal (having substantially a 50% duty cycle) or a pulse clock (having a duty cycle of less than 50%).

The operation of circuit 700 for a low-to-high input transition is as follows. Just prior to the low-to-high transition, the output node is at a logic low, and thus the output of I73 in feedback path 712 is also a logic low. Thus, each of logic gates G71 and G72 receives a logic low on one of its inputs. When the clock input (clk/pclk) is low, the output of G72 is a logic high, while the output of G71 is a logic low. Accordingly, prior to the transition and while the clock input is still low, N74 is inactive and P71 is active in the first chain, while P73 is inactive and N72 is active in the second chain. In this state, both output devices P70 and N71 are inhibited from activation (since Node 1 is pulled high and Node 2 is pulled low, respectively), while the signal on the output node is provided from storage element 707 (and in particular, from the output of I75 in this embodiment).

When the input signal undergoes the low-to-high transition, a logic high is provided to the gate terminals of N75 and N73. Transistor N73 becomes active and provides a pull down path between Node 2 and ground. When the clock signal rises following the low-to-high transition on the input node, the inputs to G71 are both logic lows ('0's), and thus the output of G71 transitions high. As a result of this, P71 will becomes inactive, while both N74 and N75 will be active, thereby providing a pull down path from Node 1 to ground. When Node 1 is pulled low, P70 becomes active and drives a logic high on the output node.

In the embodiment shown, storage element 707 includes an SR (set-reset) latch. The 'set' input ('S') is coupled to the output of I71, while the 'reset' input ('R') is coupled to Node 2. When the input signal has undergone a low-to-high transition and the clock signal has transitioned high (thereby causing a logic low on Node 1), the output of I71 transitions to a logic high. Accordingly, the SR latch is set, wherein Node 3 will fall to a logic low, while Node 4 will rise to a logic high. In this particular embodiment, the output of storage element is provided by inverter I75, which is coupled to Node 3.

When the output node is pulled high by the activation of P70, a logic high is propagated into feedback path 712. Thus, at a delay time subsequent to the output node being pulled high, a logic high is produced on the output of I73. The output of I73 is provided as an input to each of logic gates G71 and G72. Accordingly, responsive to the output node making the low-to-high transition, G71 receives a logic low and a logic high as inputs, thereby causing its output to fall low. The logic low output by G71 thus causes the deactivation of N74, cutting off the pull down path, and the activation of P71, providing a pull up path between Node 1 and VDD. When Node 1 is pulled high, P70 becomes inactive and no longer drives the output node. The logic high resulting from the low-to-high transition of the input and clock signals is then provided by the output of storage element 707 (in this case, from the output of I75). Storage element is configured such that it will continue to store the captured logic value until the next input transition is evaluated when the clock is high. If no input transition occurs, the last value stored is held by storage element 707.

When the input signal undergoes a high-to-low transition, a logic low is provided to the gate terminals of P72 and P74. Transistor P72 becomes active as a result, and pulls Node 1 high, thereby inhibiting output device P70 from activation. When the clock transitions high, logic gate G72 has logic high values on both inputs. As such, the output of G72 falls low, thereby causing the deactivation of N72. With logic lows on the gate terminals of both P73 and P74, both of these devices are now active, providing a pull up path between Node 2 and VDD. Thus, output device N71 becomes active responsive to Node 2 being pulled high. When active, N71 drives a logic low on the output node. Furthermore, when Node 2 is high, the reset input to storage element 707 is also high, thereby resulting in a logic high on Node 3 and a logic low on Node 4. A logic low is also provided on the output of I75.

The logic low on the output node is propagated into the feedback path, and eventually results in a logic low on one of the inputs of G72, which in turn results in the output of G72 transitioning from low to high. When the output from G72 transitions high, P73 becomes inactive while N72 becomes active. Thus, the pull up path from Node 2 is cut off, and a pull down path from Node 2 to ground is provided through N72. Thus, Node 2 is pulled low and N71 becomes inactive. After the clock falls low again, both P71 and N72 are active, as G71 provides a logic low output while G72 provides a logic high output.

In general, circuit 700 is configured such that evaluation occurs only when the clock is high. Similarly, circuit 700 is configured such that output transitions occur only when the clock is high. When the clock is low, transitions on the input node are not evaluated. It should be noted however that embodiments are possible and contemplated where the evaluation and output transitions occur when the clock is low, and wherein evaluation is inhibited when the clock is high.

Figure 8:
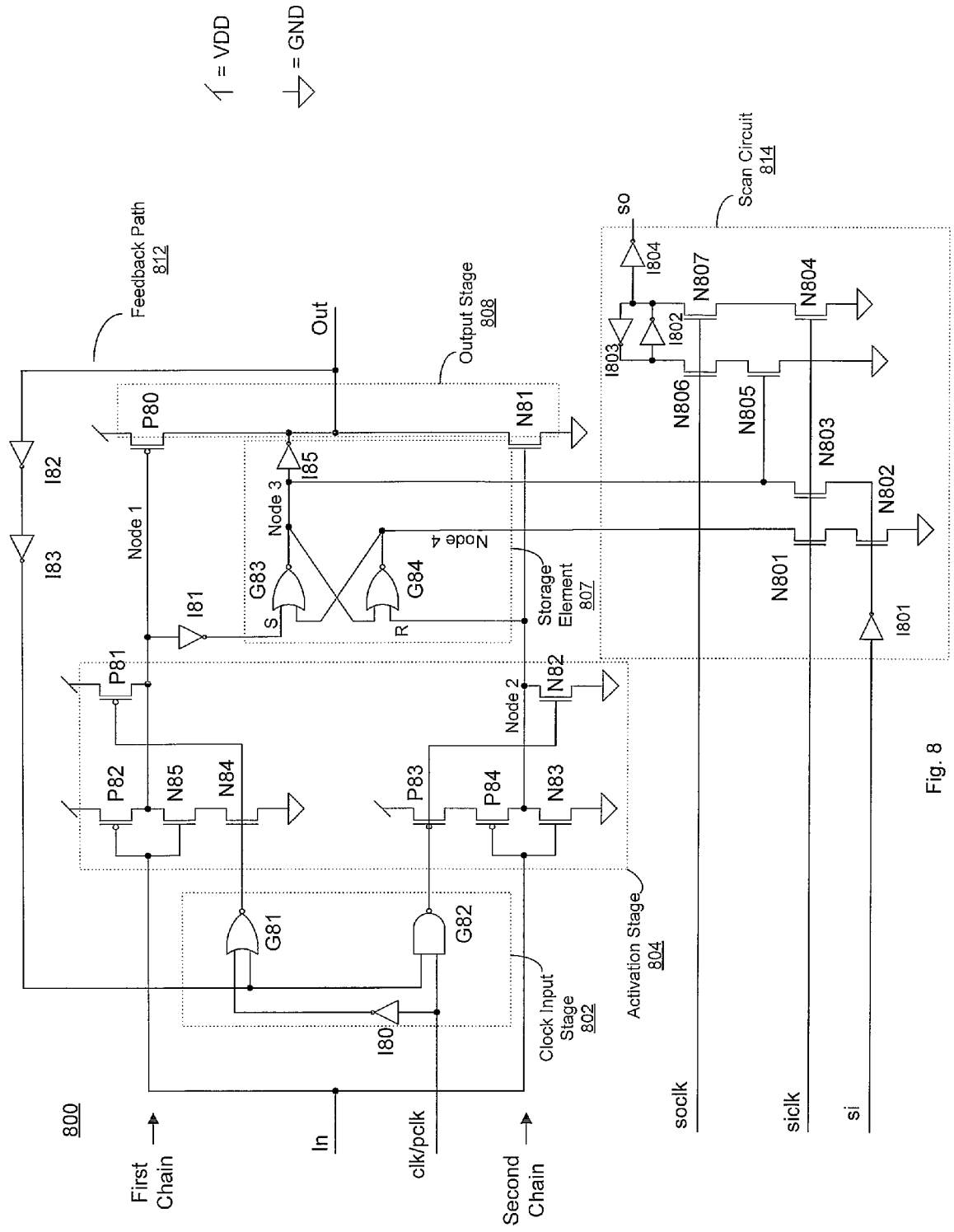
FIG. 8 is a schematic diagram of another embodiment of a transit state element circuit that incorporates the functions of a repeater and a state element and further incorporates scan functionality.

FIG. 8 is a schematic diagram of another embodiment of a transit state element circuit that incorporates the functions of a repeater and a state element and further incorporates scan functionality. During normal operation, circuit 800 is configured to function the same as circuit 700 discussed above, while scan circuit 814 is configured to remain inactive. During scan-in operations, scan circuit 814 is configured to input a logic value to storage element 807 through the scan-in input ('si') when the scan-in clock ('siclk') is high. During scan-out operations, scan circuit 814 is configured to provide the logic value stored in storage element 807 to the scan-out output ('so') when the scan-out clock ("soclk") is high.

Accordingly, circuit 800 is enabled for scan testing. Scan circuit 814 may be part of a chain of scan circuits that are coupled to various types of state elements. The scan chain may thus enable the inputting of test vectors and the outputting of captured logic values from the state elements associated with the scan circuits of the chain.

In general, the transit state element circuits described herein include a clock input stage, an activation stage, a storage element, and an output stage. Each of these stages may be implemented in various configurations, and are not limited to those shown herein. For a given embodiment, the activation stage is configured to sense a transition of an input signal and enable activation of the output stage in accordance with the clock input stage. When the clock input stage receives the clock signal at a first level, the activation stage enables the output stage to drive an output signal on an output node. A new logic value corresponding to the input transition is also captured and stored by the storage element when the output stage is active. A feedback signal is received, after a delay time, by the clock input stage, which is configured to deactivate the activation stage responsive thereto (which, in turn, causes the deactivation of the output stage). When the clock signal transitions to the second level, the activation and output stages are inhibited from any further changes, while the storage element stores the captured logic value and provides it as the output of the transit state element.

Figure 9:
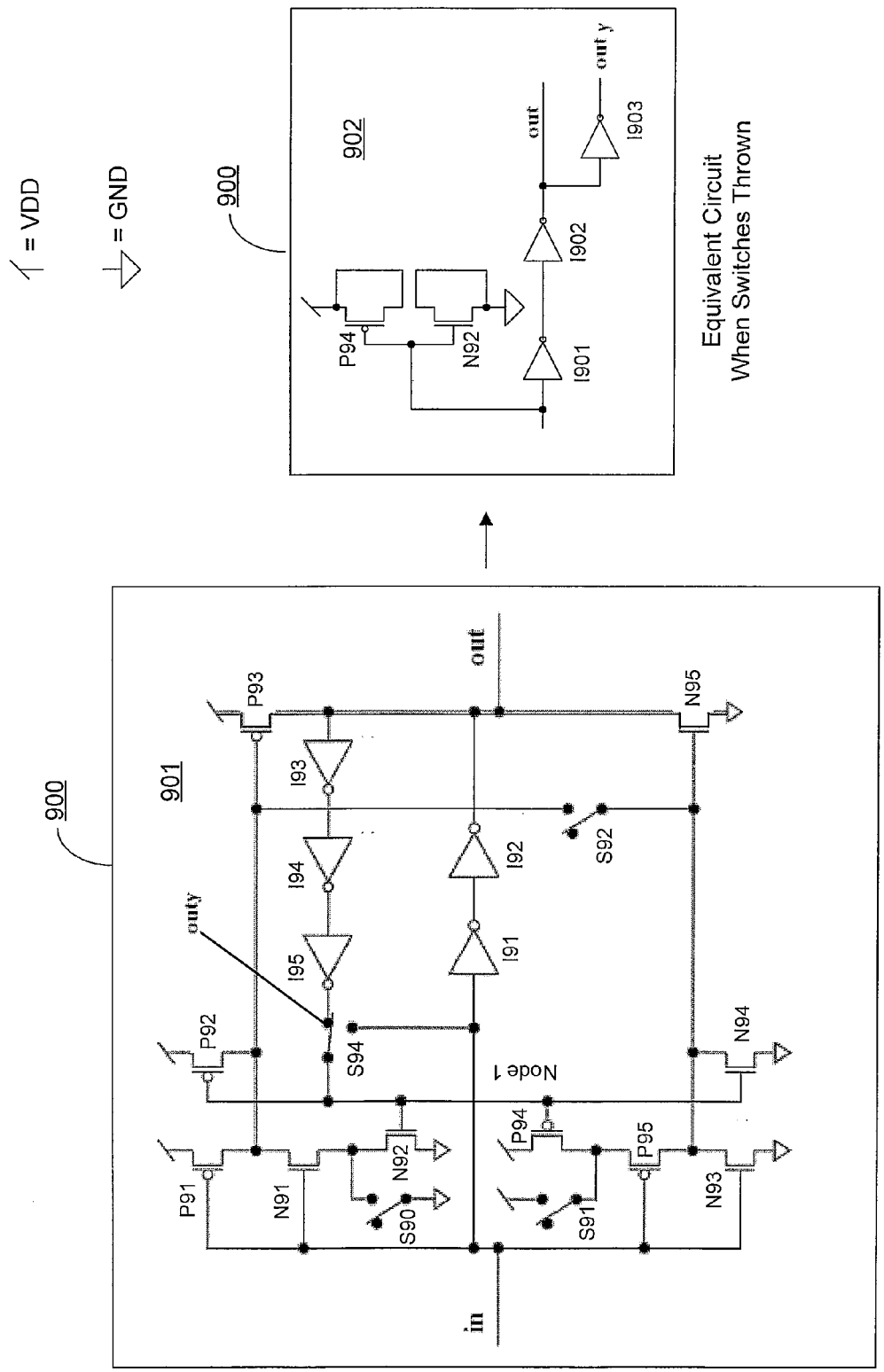
FIG. 9 is a schematic diagram of one embodiment of a repeater circuit that may be converted to a conventional repeater circuit.
Figure 10:
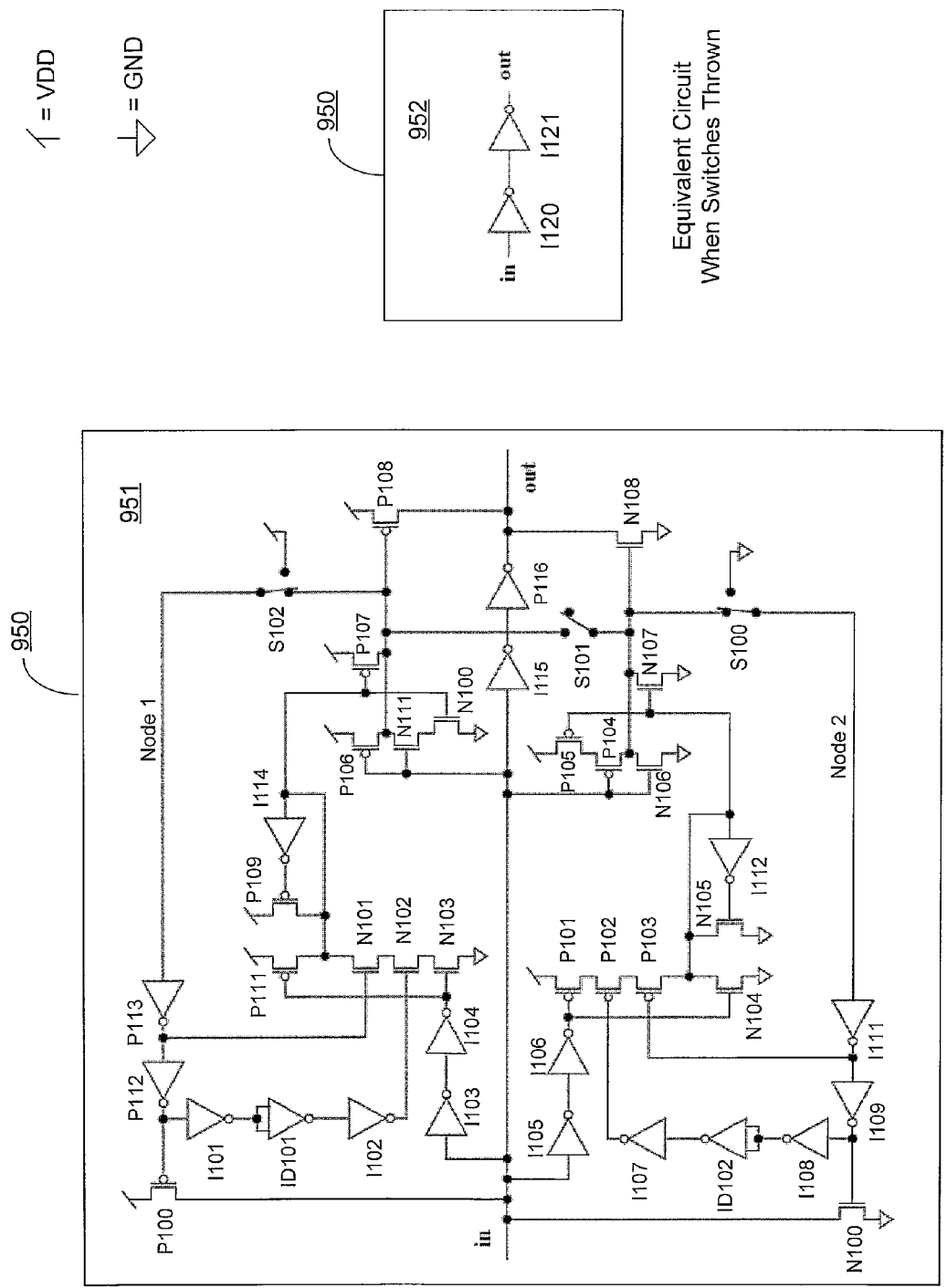
FIG. 10 is a schematic diagram of one embodiment of an echo repeater circuit that may be converted to a conventional repeater circuit.

Conversion of Dynamic Repeater Circuits to Static Repeater Circuits:

FIG. 9 is a schematic diagram of one embodiment of a repeater circuit that may be converted to a conventional repeater circuit, while FIG. 10 is a schematic diagram of one embodiment of an echo repeater circuit that may be converted to a conventional repeater circuit. In some cases, a dynamic repeater circuit may be converted into a conventional, static repeater circuit during the manufacturing phase of an integrated circuit upon which it is implemented. In such a case, the converted repeater circuit operates as a static repeater circuit thereafter. However, embodiments are also possible and contemplated wherein the switches are reconfigurable, and thus the circuit may at some times operate as a static repeater and other times as a dynamic repeater.

Referring now to FIG. 9, repeater circuit 901 is implemented on integrated circuit (IC) die 900. It should be noted that the circuit shown on IC 900 is but one of many different circuits that may also be implemented on the same die. However, for the sake of simplicity, these circuits are not shown. Circuit 901 includes an input stage (left hand side), a dynamic output stage (which includes P93 and N95), and a feedback path that includes serially coupled inverters I93, I94, and I95. The embodiment includes a plurality of selection devices S90, S91, S92, and S94, which are shown symbolically as switches, each of which has a first position (as shown, in the first configuration) and a second position (corresponding to a second configuration). However, selection devices other than switches are also possible and contemplated. For example, in an embodiment wherein the circuit is to undergo an on-die change to become a static repeater circuit, a metal change may be made that places each of the selection devices in the second position. In such an embodiment, once the metal change has been made, the circuit is permanently converted. The equivalent circuit, after conversion, is shown as circuit 902 in FIG. 9.

Conversion of one embodiment of a dynamic repeater circuit to a static repeater circuit may be performed by disconnecting the feedback path, shorting the gate terminals of the output stage devices, bypassing series devices in the first stage, and connecting precharge devices to the logic input of their respective stage. In order to convert circuit 901 into circuit 902, S94 is changed from the first position (as shown) into the second position, which shorts Node 1 to the input node, while disconnecting the feedback path. Changing S94 from the first position to the second position also causes, in this embodiment, precharge devices P92 and N94 (and more particularly, their respective gate terminals) to be coupled to the input node, which is the logic input of the first stage of circuit 901. The gate terminals of the output devices, P93 and N95, may be shorted together by changing S92 from its first position (as shown) into the second position. Series devices P94 and N92 may be bypassed by changing S91 and S90, respectively, from their first (shown) positions into their respective second positions. For N92, this effectively results in both the gate and drain terminals being coupled directly to ground, while both the gate and drain terminals of P94 are coupled to VDD.

As a result of the changes discussed above, circuit 901 is converted into circuit 902, which includes series-coupled inverters I901 and I902 coupled between the input and output nodes, inverter I903 (effectively in series with I901 and I902), and transistors P94 and N92, which are parasitic loads with no circuit function. Accordingly, depending on the connections made to the output nodes (out and outy), circuit 902 may function as a double inverter static repeater (I901 and I902), a triple inverter static repeater (I901, I901, and I903), or both.

With respect to the embodiment shown in FIG. 10, echo repeater circuit 951 (on IC die 950, which may include a number of other circuits that are not shown for the sake of simplicity), conversion to circuit 952 may be performed by changing the position of selection devices S100, S101, and S102. Changing the position of S101 from the first (shown) position results in the shorting of the gate terminals of output devices P108 and N108. Changing the position of S100 from the first (shown) position to the second position effectively disconnects the lower feedback path by coupling Node 2 directly to ground. Changing the position of S102 from the first (shown) position to the second position effectively disconnects the upper feedback path by coupling Node 1 directly to VDD. The resulting circuit is shown as circuit 952, which includes inverters I120 and I121 coupled together in series.

One method of converting discussed above involves making metal only changes to an IC die at the time of manufacture, after which the conversion is permanent. However, embodiments are possible and contemplated wherein the change is not permanent, and thus the various selection devices are switches that may be changed from the first position to the second position and vice versa more than once. The switches may be implemented using any suitable form of switch. Accordingly, when the switches are in the first position, circuits 901 and 951 act as dynamic repeater circuits, with all of their respective stages enabled and operational, as previously described. When in the second position, these circuits act as static repeater circuits (e.g., their respective counterparts 902 and 952). Such reconfigurable repeater circuits may be useful where both static and dynamic repeater circuits may be desirable. For example, a first operational mode may include one or more such repeater circuits acting as dynamic repeater circuits, while a second operational mode may include one or more of the same repeater circuits operating as static repeater circuits.

Although a number of different repeater circuits are disclosed herein, it is noted that these embodiments are exemplary, and that other embodiments are possible and contemplated. Such embodiments may used devices of other polarities than those shown here, and may be triggered by different logic levels (high or low), and may produce different logic levels on the various circuit nodes (internal nodes as well as any output nodes). Different types of logic gates and arrangements thereof may also be used. Accordingly, various circuit topologies may be used to implement the circuits and their various stages discussed herein while falling within the spirit and scope of this disclosure.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. An electronic circuit comprising:
a clock input stage coupled to receive a clock signal, wherein the clock signal alternates between a first logic level and a second logic level;
an output stage configured to drive an output signal on an output node;
an activation stage coupled to an input node, wherein the activation stage is configured to, responsive to the clock input stage detecting a transition from the first logic level to the second logic level and detecting a logical transition of an input signal on the input node, activate the output stage to drive an output signal on the output node, and wherein the activation stage is configured to inhibit the output stage from activation when the clock signal is at the first logic level;
a feedback path coupled to receive the output signal from the output node and coupled to provide a feedback signal based on the output signal to the clock input stage, wherein, at a delay time subsequent to activation of the output stage, the clock input stage is configured to deactivate the activation stage responsive to receiving the feedback signal, and wherein the output stage is configured to be deactivated responsive to deactivation of the activation stage; and
a storage element, wherein the storage element is configured to capture a logic value of the input signal when the clock is at the second logic level, store the logic value of the input signal after the clock signal transitions to the first logic level, and to provide the output signal on the output node when the clock signal is at the first logic level.

2. The electronic circuit as recited in claim 1, wherein:
the activation stage includes a first activation circuit coupled to the input node and a second activation circuit coupled to the input node;
the output stage includes a first output circuit coupled to the first activation circuit and the output node, and a second output circuit coupled to the second activation circuit and the output node.

3. The electronic circuit as recited in claim 2, wherein:
the first activation circuit is configured to activate the first output circuit and the first output circuit is configured to drive the output signal on the output node at the second logic level responsive to the input signal and the clock signal transitioning to the second logic level; and the second activation circuit is configured to activate the second output circuit and the second output circuit is configured to drive the output signal on the output node at the first logic level responsive to the input signal transitioning to the first logic level and the clock signal transitioning to the second logic level.

4. The electronic circuit as recited in claim 3, wherein:
the first activation circuit is configured to inhibit activation of the first output signal when the second output circuit is activated; and
the second activation circuit is configured to inhibit activation of the second output circuit when the first output circuit is activated.

5. The electronic circuit as recited in claim 3, wherein the first and second activation circuits are configured to inhibit the first and second output circuits, respectively, when the input signal has the same logic value in a current clock cycle as in the preceding clock cycle.

6. The electronic circuit as recited in claim 1, wherein the storage element includes a pair of cross-coupled logic gates.

7. The electronic circuit as recited in claim 6, wherein the storage element includes two cross-coupled NOR gates and an inverter coupled between an output of one of the NOR gates and the output node.

8. The electronic circuit as recited in claim 1, wherein the clock signal is a level signal having a 50% duty cycle.

9. The electronic circuit as recited in claim 1, wherein the clock signal is a pulse having a duty cycle of less than 50%.

10. The electronic circuit as recited in claim 1, wherein the electronic circuit further includes scan circuitry, wherein the scan circuitry is configured to input to the storage element a scan input value responsive to a scan input clock, and further configured to read, from the storage element, a scan output value responsive to a scan output clock.

11. A method comprising:
a clock input stage receiving a clock signal, wherein the clock signal alternates between a first logic level and a second logic level;
detecting a logical transition of a first input signal on an input node;
an activation stage activating an output stage responsive to the clock signal transitioning to the second logic level and said detecting the logical transition of the first input signal;
driving an output signal on an output node responsive to said activating;
capturing, in a storage element, a logic value of the first input signal responsive to the clock signal transitioning to the second logic level;
deactivating the output stage responsive to the clock input stage receiving a feedback signal via a feedback path having an input coupled to the output node;
storing, in the storage element, the logic value of the first input signal subsequent to the clock signal transitioning from the second logic level to the first logic level; and
providing the output signal, from the storage element, subsequent to the clock signal transitioning from the second logic level to the first logic level.

12. The method as recited in claim 11, wherein said driving the output signal is performed by an output stage having a first output circuit and a second output circuit, and wherein the method further comprises:
driving, using the first output circuit, the output signal at the second logic level responsive to the input signal and the clock signal transitioning to the second logic level; and
driving, using the second output circuit, the output signal at the first logic level responsive to the first input signal transitioning to the first logic level and the clock signal transitioning to the second logic level.

13. The method as recited in claim 12 further comprising:
inhibiting the second output circuit when the first output circuit is driving the output signal; and
inhibiting the first output circuit when the second output circuit is driving the output signal.

14. The method as recited in claim 12 further comprising inhibiting both the first and second output circuits when the first input signal has the same logic value in a current clock cycle as in the preceding clock cycle.

15. The method as recited in claim 11, wherein the clock signal is a level signal having a 50% duty cycle.

16. The method as recited in claim 11, wherein the clock signal is a pulse having a duty cycle of less than 50%.

17. An electronic circuit comprising:
a clock input circuit coupled to receive a clock signal;
an output circuit configured to drive an output signal on an output node;
a feedback path coupled to receive the output signal from the output node and configured to provide a delayed version of the output signal to the clock input circuit;
an activation circuit coupled to the clock input circuit and the output circuit, wherein the activation circuit is configured to configured to activate the output circuit responsive to detecting a transition of an input signal on an input node and a transition of the clock signal from a first level to a second level; and
a storage circuit coupled to the activation circuit and the output node and configured to capture and store a logic value of the input signal when the clock signal is at the second level;
wherein the output circuit is configured to, when active, drive the output signal at the logic value of the input signal;
wherein the clock input circuit is configured to deactivate the activation circuit at a delay time subsequent to activation of the activation circuit;
wherein the activation circuit is configured to inhibit the output circuit when the clock signal returns to the first logic level; and
wherein the storage circuit is configured to provide the output signal at the logic value on the output node responsive to capturing the logic value and subsequent to inhibiting the output circuit.

18. The electronic circuit as recited in claim 17, wherein the clock signal is a level signal having a 50% duty cycle.

19. The electronic circuit as recited in claim 17, wherein the clock signal is a pulse having less than a 50% duty cycle.

* * * * *